US012581947B2

(12) United States Patent
Araki et al.

(10) Patent No.: US 12,581,947 B2
(45) Date of Patent: Mar. 17, 2026

(54) POWER SEMICONDUCTOR DEVICE, POWER CONVERSION DEVICE, AND ELECTRIC SYSTEM

(71) Applicant: Hitachi Astemo, Ltd., Hitachinaka (JP)

(72) Inventors: Takahiro Araki, Tokyo (JP); Takeshi Tokuyama, Tokyo (JP); Shigehisa Aoyagi, Hitachinaka (JP); Noriyuki Maekawa, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 396 days.

(21) Appl. No.: 18/034,305

(22) PCT Filed: Sep. 17, 2021

(86) PCT No.: PCT/JP2021/034314
§ 371 (c)(1),
(2) Date: Apr. 27, 2023

(87) PCT Pub. No.: WO2022/091633
PCT Pub. Date: May 5, 2022

(65) Prior Publication Data
US 2023/0395457 A1      Dec. 7, 2023

(30) Foreign Application Priority Data
Oct. 30, 2020      (JP) ................................. 2020-183263

(51) Int. Cl.
*H01L 23/367*      (2006.01)
*H01L 23/00*      (2006.01)
(Continued)

(52) U.S. Cl.
CPC .... *H01L 23/3672* (2013.01); *H01L 23/49822* (2013.01); *H01L 23/5223* (2013.01);
(Continued)

(58) Field of Classification Search
CPC ........... H01L 23/3672; H01L 23/49822; H01L 23/5223; H01L 24/40; H01L 2224/40137;
(Continued)

(56) References Cited

U.S. PATENT DOCUMENTS

2002/0180037 A1*  12/2002  Shirakawa .............. H01L 24/72
257/722
2012/0300522 A1*  11/2012  Tokuyama ........ H01L 23/49575
257/691
(Continued)

FOREIGN PATENT DOCUMENTS

JP          10-304680 A      11/1998
JP          2009-225612 A    10/2009
(Continued)

OTHER PUBLICATIONS

International Search Report (PCT/ISA/210) issued in PCT Application No. PCT/JP2021/034314 dated Oct. 26, 2021 with English translation (four (4) pages).
(Continued)

*Primary Examiner* — Thienvu V Tran
*Assistant Examiner* — Lauren Ashley Shaw
(74) *Attorney, Agent, or Firm* — Crowell & Moring LLP

(57)      ABSTRACT
A power semiconductor device includes: a substrate in which a positive electrode wiring connected to a first conductor on a high potential side and a negative electrode wiring connected to a fourth conductor on a low potential side are provided on one surface, and an output wiring connected to a second conductor and a third conductor is provided on the other surface so as to face the positive electrode wiring and the negative electrode wiring; and a first capacitor that smooths DC power supplied to a first upper-arm circuit body and a first lower-arm circuit body. The substrate is disposed between the first upper-arm circuit (Continued)

body and the first lower-arm circuit body. The first capacitor is disposed between the first upper-arm circuit body and the first lower-arm circuit body, and is connected to the positive electrode wiring and the negative electrode wiring on the substrate.

8 Claims, 10 Drawing Sheets

(51) Int. Cl.

| | |
|---|---|
| *H01L 23/498* | (2006.01) |
| *H01L 23/522* | (2006.01) |
| *H02M 7/00* | (2006.01) |
| *H02M 7/5387* | (2007.01) |
| *H05K 1/02* | (2006.01) |

(52) U.S. Cl.
CPC ............ *H01L 24/40* (2013.01); *H02M 7/003* (2013.01); *H02M 7/5387* (2013.01); *H05K 1/0231* (2013.01); *H01L 2224/40137* (2013.01); *H01L 2224/40265* (2013.01); *H01L 2924/13055* (2013.01); *H01L 2924/19041* (2013.01)

(58) Field of Classification Search
CPC . H01L 2224/40265; H01L 2924/13055; H01L 2924/19041; H02M 7/003; H02M 7/5387; H05K 1/0231

USPC ........................................................ 363/17
See application file for complete search history.

(56) References Cited

U.S. PATENT DOCUMENTS

| | | | |
|---|---|---|---|
| 2013/0141871 A1 | 6/2013 | Omae et al. | |
| 2013/0258736 A1 | 10/2013 | Higuchi et al. | |
| 2017/0148770 A1 | 5/2017 | Ishino et al. | |
| 2020/0266727 A1* | 8/2020 | Tsuchimochi | ...... H01L 23/3735 |

FOREIGN PATENT DOCUMENTS

| | | |
|---|---|---|
| JP | 2013-252009 A | 12/2013 |
| JP | 2015-39295 A | 2/2015 |
| JP | 2015-211524 A | 11/2015 |
| WO | WO 2012/073571 A1 | 6/2012 |

OTHER PUBLICATIONS

Japanese-language Written Opinion (PCT/ISA/237) issued in PCT Application No. PCT/JP2021/034314 dated Oct. 26, 2021 (three (3) pages).

* cited by examiner

POWER SEMICONDUCTOR DEVICE, POWER CONVERSION DEVICE, AND ELECTRIC SYSTEM

TECHNICAL FIELD

The present invention relates to a power semiconductor device, a power conversion device, and an electric system.

BACKGROUND ART

A power conversion device includes a capacitor for smoothing DC power and a switching element for converting a DC current into an AC current. At the time of switching the switching element, a surge voltage proportional to the inductance of the wiring path is generated along with a rapid change in the current, so that the inductance of the wiring path is required to be reduced.

PTL 1 discloses a semiconductor module constituting a three-phase inverter circuit including an upper arm and a lower arm for three phases, the semiconductor module including a multilayer wiring bus bar, in which an output wiring layer is configured by laminating a U-phase wiring layer, a V-phase wiring layer, and a W-phase wiring layer connected to intermediate potential points of the upper arm and the lower arm of each of the three phases.

CITATION LIST

Patent Literature

PTL 1: JP 2015-211524 A

SUMMARY OF INVENTION

Technical Problem

In the device of PTL 1, the wiring path including the capacitor is not considered, and the wiring path becomes long, and the inductance of the wiring path cannot be reduced.

Solution to Problem

A power semiconductor device according to the present invention is a power semiconductor device including a first upper-arm circuit body configured by sandwiching a first switching element constituting an upper-arm circuit between a first conductor and a second conductor; and a first lower-arm circuit body configured by sandwiching a second switching element constituting a lower-arm circuit between a third conductor and a fourth conductor, the power semiconductor device including: a substrate in which a positive electrode wiring connected to the first conductor on a high potential side and a negative electrode wiring connected to the fourth conductor on a low potential side are provided on one surface, and an output wiring connected to the second conductor and the third conductor is provided on the other surface so as to face the positive electrode wiring and the negative electrode wiring; and a first capacitor that smooths DC power supplied to the first upper-arm circuit body and the first lower-arm circuit body, wherein the substrate is disposed between the first upper-arm circuit body and the first lower-arm circuit body, and the first capacitor is disposed between the first upper-arm circuit body and the first lower-arm circuit body, and is connected to the positive electrode wiring and the negative electrode wiring on the substrate.

Advantageous Effects of Invention

According to the present invention, the inductance of the wiring path can be reduced.

DESCRIPTION OF EMBODIMENTS

Figure 1:
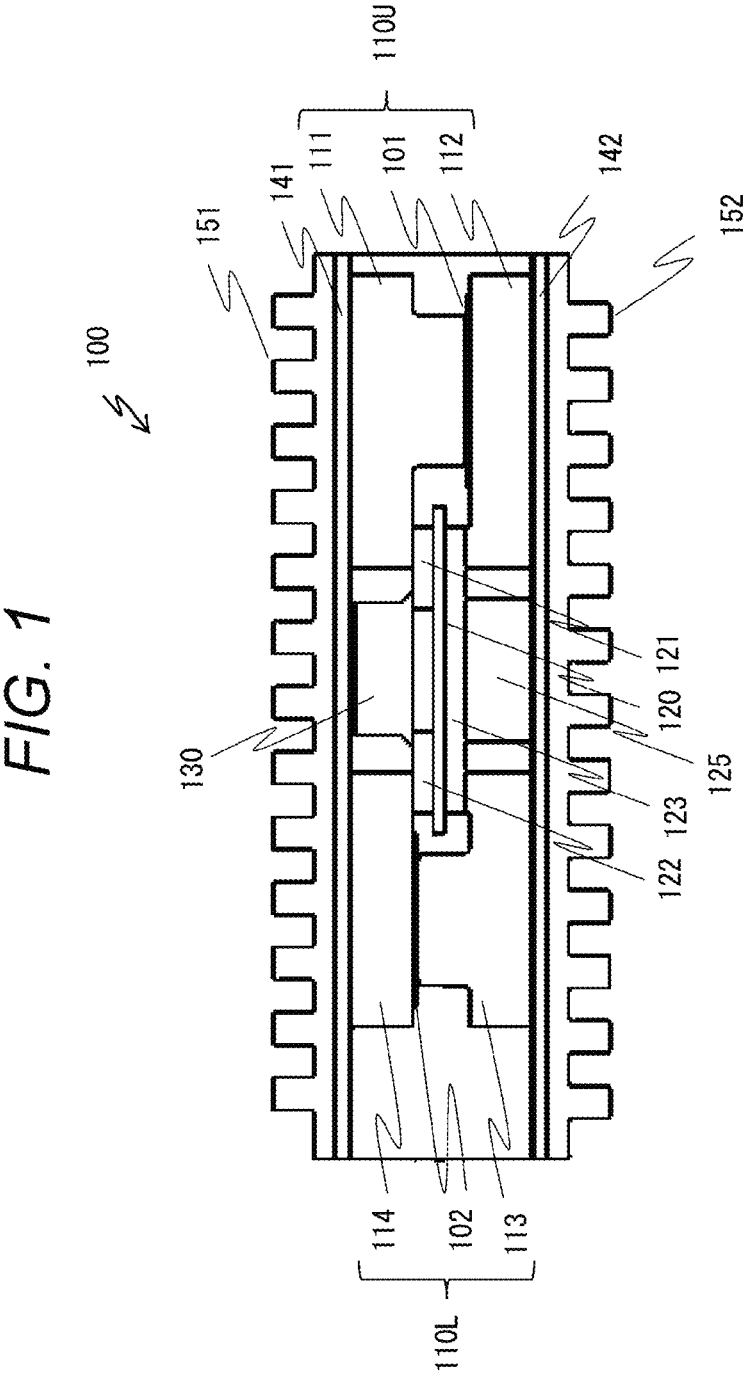
FIG. 1 is a cross-sectional view of a power semiconductor device.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

In a case where there is a plurality of components having the same or similar functions, the same reference numerals may be attached with different subscripts for description. However, in a case where it is not necessary to distinguish the plurality of components, the description may be made while omitting the subscript.

First Embodiment

FIG. 1 is a cross-sectional view of a power semiconductor device 100. This cross-sectional view is a cross-sectional view taken along line X-X in a perspective view of the power semiconductor device 100 illustrated in FIG. 4 described later.

The power semiconductor device 100 includes a first upper-arm circuit body 110U configured by sandwiching a first switching element 101 constituting an upper-arm circuit between a first conductor 111 and a second conductor 112, and a first lower-arm circuit body 110L configured by sandwiching a second switching element 102 constituting a lower-arm circuit between a third conductor 113 and a fourth conductor 114.

The positive electrode of the first switching element 101 is bonded to the first conductor 111 by solder or the like, and the negative electrode is bonded to the second conductor 112 by solder or the like. The first conductor 111 and the second conductor 112 are made of a conductor such as copper or aluminum.

The positive electrode of the second switching element 102 is bonded to the third conductor 113 by solder or the like, and the negative electrode is bonded to the fourth conductor 114 by solder or the like. The third conductor 113 and the fourth conductor 114 are made of a conductor such as copper or aluminum.

A substrate 120 is disposed between the first upper-arm circuit body 110U and the first lower-arm circuit body 110L. The substrate 120 is insulative and made of resin or ceramic.

A positive electrode wiring 121 connected to the first conductor 111 on the high potential side and a negative electrode wiring 122 connected to the fourth conductor 114 on the low potential side are provided on one surface (an upper surface of the figure, hereinafter referred to as a front surface) of the substrate 120. An output wiring 123 connected to the second conductor 112 and the third conductor 113 is provided on the other surface (a lower surface of the figure, hereinafter referred to as a back surface) of the substrate 120 so as to face the positive electrode wiring 121 and the negative electrode wiring 122. That is, the positive electrode wiring 121, the negative electrode wiring 122, and the output wiring 123 are laminated on the front and back of the substrate 120. The positive electrode wiring 121, the negative electrode wiring 122, and the output wiring 123 are bonded to the substrate 120, and are pattern-formed on the substrate 120 by etching or the like. An output terminal conductor 125 is connected to the output wiring 123.

The first conductor 111 is bonded to the positive electrode wiring 121 by solder or the like, the second conductor 112 is bonded to the output wiring 123 by solder or the like, the third conductor 113 is bonded to the output wiring 123 by solder or the like, and the fourth conductor 114 is bonded to the negative electrode wiring 122 by solder or the like.

A first capacitor 130 is disposed between the first upper-arm circuit body 110U and the first lower-arm circuit body 110L, and a terminal on a positive electrode side of the first capacitor 130 is bonded to the positive electrode wiring 121 on the substrate 120, and a terminal on a negative electrode side of the first capacitor 130 is bonded to the negative electrode wiring 122 on the substrate 120 by solder or the like. The first capacitor 130 smooths DC power supplied to the first upper-arm circuit body 110U and the first lower-arm circuit body 110L. As the first capacitor 130, a compact capacitor having high heat resistance, such as a ceramic capacitor or a film capacitor, is used.

A gap between the first upper-arm circuit body 110U, the first lower-arm circuit body 110L, the substrate 120, and the first capacitor 130 is filled with a molding resin. That is, the first upper-arm circuit body 110U, the first lower-arm circuit body 110L, the substrate 120, and the first capacitor 130 are sealed with a molding resin.

A first cooler 151 is provided on surfaces of the first conductor 111 and the fourth conductor 114 opposite to the surfaces facing the first switching element 101 and the second switching element 102 via an insulator 141. Although only the cooling fin is illustrated in the first cooler 151, the cooling fin is covered by a housing (not illustrated), and a refrigerant such as air or cooling water flows inside.

A second cooler 152 is provided on surfaces of the second conductor 112 and the third conductor 113 opposite to the surfaces facing the first switching element 101 and the second switching element 102 via an insulator 142. Although only the cooling fin is illustrated in the second cooler 152, the cooling fin is covered by a housing (not illustrated), and a refrigerant such as air or cooling water flows inside.

The insulators 141 and 142 are made of ceramic or a resin sheet. A heat dissipating grease layer such as silicon grease may be added to both sides or one side of the insulators 141 and 142.

The cooling fins of the first cooler 151 and the second cooler 152 are made of a material having high thermal conductivity such as copper or aluminum. The first cooler 151 and the second cooler 152 can increase the surface area and improve the cooling performance by forming cooling fins and irregularities.

The upper surface of the first capacitor 130 is set lower than the upper surfaces of the first conductor 111 and the fourth conductor 114. In other words, the insulator 141 is provided in close contact with the upper surfaces of the first conductor 111 and the fourth conductor 114, and the first cooler 151 is further provided via the insulator 141, but a gap is provided between the upper surface of the first capacitor 130 and the insulator 141. Therefore, even if the lower surface of the first cooler 151 has some irregularities, the first cooler 151 can be brought into close contact with the upper surfaces of the first conductor 111 and the fourth conductor 114 without interference of the first capacitor 130. As a result, the first cooler 151 is easily formed, and the cooling performance is also improved. The gap between the upper surface of the first capacitor 130 and the insulator 141 is filled with a molding resin.

In the present embodiment, the first upper-arm circuit body 110U, the first capacitor 130 on the substrate 120, and the first lower-arm circuit body 110L are arranged in a straight line. Then, the positive electrode wiring 121 and the negative electrode wiring 122 are provided on the front surface of the substrate 120, and the output wiring 123 is provided on the back surface of the substrate 120, that is, the positive electrode wiring 121 and the negative electrode wiring 122 and the output wiring 123 are provided to face each other, in other words, to be laminated.

Figure 2:
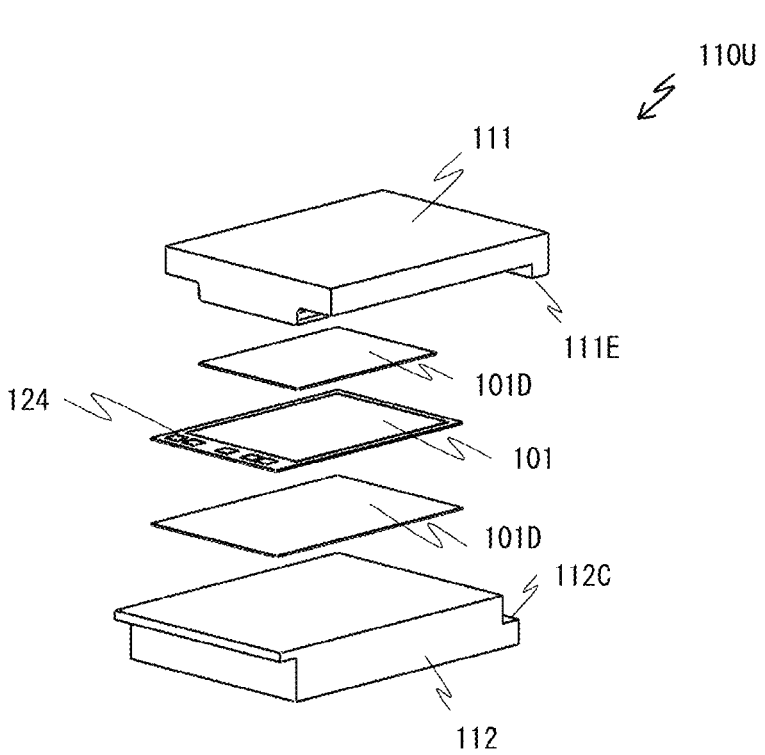
FIG. 2 is an exploded perspective view of a main part of a first upper-arm circuit body of the power semiconductor device.

FIG. 2 is an exploded perspective view of a main part of the first upper-arm circuit body 110U of the power semiconductor device 100.

A control signal wiring 124 is led out from the gate electrode of the first switching element 101. An upper surface in the figure of the first switching element 101 is an emitter electrode, and a lower surface in the figure is a collector electrode. Although not illustrated in FIG. 1, the emitter electrode of the first switching element 101 is bonded to the first conductor 111 via a bonding material 101D such as solder. The collector electrode of the first switching element 101 is bonded to the second conductor 112 via the bonding material 101D.

The first conductor 111 has a connection terminal 111E connected to the positive electrode wiring 121 on the substrate 120. The second conductor 112 has a connection terminal 112C connected to the output wiring 123 on the substrate 120. Here, the connection terminal 111E and the connection terminal 112C are bonded to the positive electrode wiring 121 and the output wiring 123 on the substrate 120 in a wide area.

Figure 3:
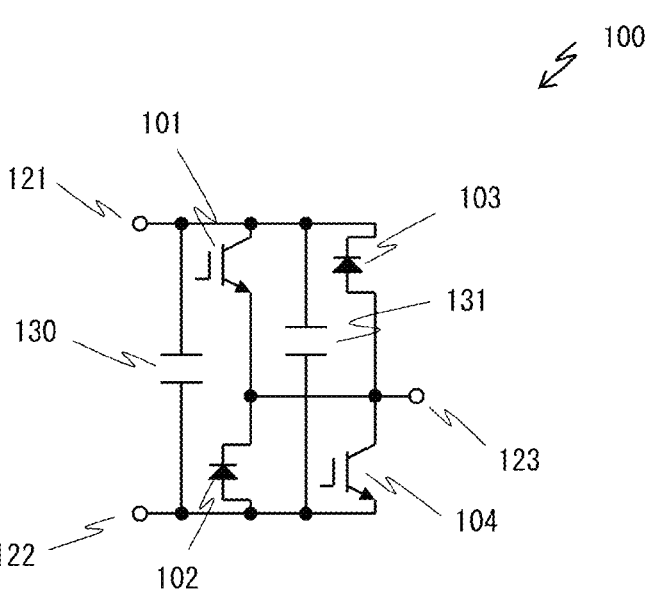
FIG. 3 is a circuit configuration diagram of the power semiconductor device.

FIG. 3 is a circuit configuration diagram of the power semiconductor device 100.

The power semiconductor device 100 includes the first switching element 101 constituting an upper-arm circuit, the second switching element 102 constituting a lower-arm circuit, and the first capacitor 130 disposed in parallel between the upper-arm circuit and the lower-arm circuit. The positive electrode wiring 121 is connected to the upper-arm circuit, the negative electrode wiring 122 is connected to the lower-arm circuit, and a connection point between the first switching element 101 and the second switching element 102 is connected to the output wiring 123.

The power semiconductor device 100 further includes a third switching element 103 constituting an upper-arm circuit and connected in parallel to the first switching element 101, a fourth switching element 104 constituting a lower-arm circuit and connected in parallel to the second switching element 102, and a second capacitor 131 disposed in parallel between the upper-arm circuit and the lower-arm circuit. The positive electrode wiring 121 is connected to the upper-arm circuit, the negative electrode wiring 122 is connected to the lower-arm circuit, and a connection point between the third switching element 103 and the fourth switching element 104 is connected to the output wiring 123.

The control signal wiring 124 (see FIG. 2), which is not illustrated, is derived from the gate electrodes of the first switching element 101 and the fourth switching element 104.

The first switching element 101 and the fourth switching element 104 are power semiconductor elements including IGBTs, MOSFETs, or the like. The second switching element 102 and the third switching element 103 are diodes.

The circuit configuration diagram illustrated in FIG. 3 illustrates one phase of the power semiconductor device 100 used as an inverter for driving a motor. In this case, in the power semiconductor device 100, at least the first switching element 101, the second switching element 102, and the first capacitor 130 may be configured as one phase.

Figure 4:
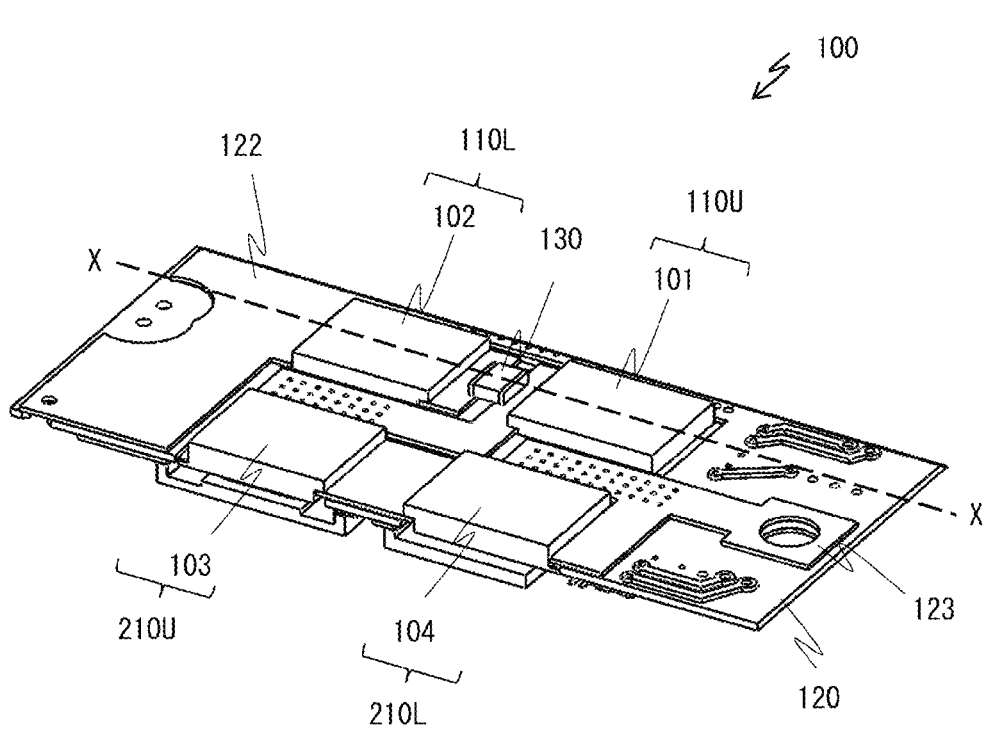
FIG. 4 is a perspective view of a front surface of a substrate of the power semiconductor device.
Figure 5:
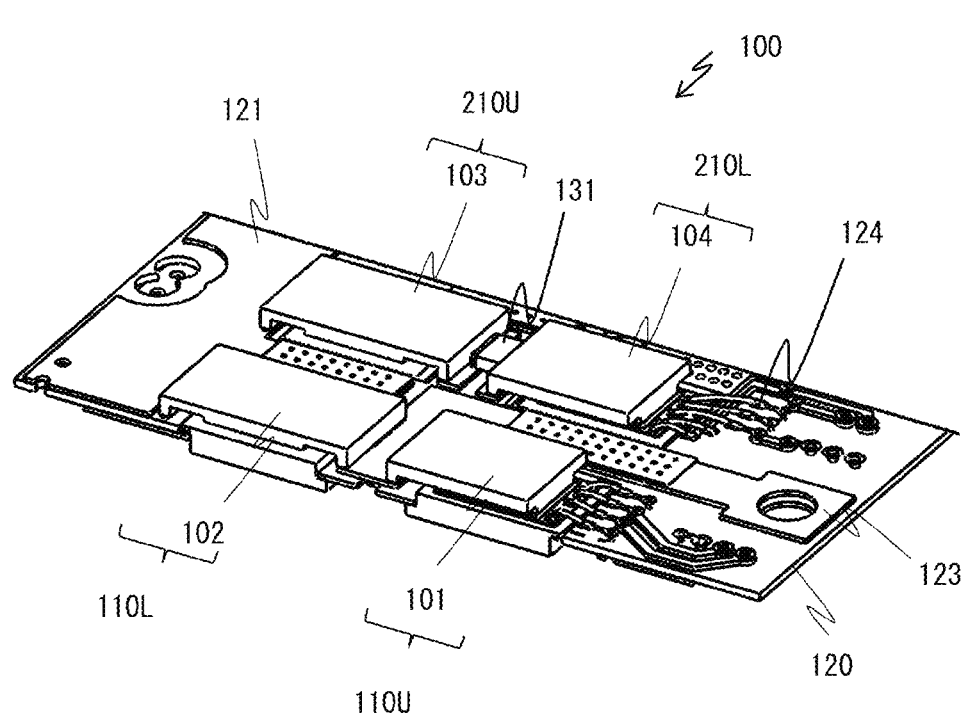
FIG. 5 is a perspective view of a back surface of a substrate of the power semiconductor device.

FIG. 4 is a perspective view of a front surface of the substrate 120 of the power semiconductor device 100. FIG. 5 is a perspective view of a back surface of the substrate 120 of the power semiconductor device 100. These figures illustrate a state in which the first cooler 151 and the second cooler 152 are removed.

The first upper-arm circuit body 110U on which the first switching element 101 is mounted is connected in series to the first lower-arm circuit body 110L on which the second switching element 102 is mounted via the output wiring 123 provided on the substrate 120.

The second upper-arm circuit body 210U on which the third switching element 103 is mounted is connected in series to the second lower-arm circuit body 210L on which the fourth switching element 104 is mounted via the output wiring 123 provided on the substrate 120.

The first upper-arm circuit body 110U on which the first switching element 101 is mounted is connected in parallel to the second upper-arm circuit body 210U on which the third switching element 103 is mounted via wiring provided on the substrate 120. The first lower-arm circuit body 110L on which the second switching element 102 is mounted is connected in parallel to the second lower-arm circuit body 210L on which the fourth switching element 104 is mounted via wiring provided on the substrate 120.

As illustrated in FIG. 4, the first capacitor 130 is disposed between the first upper-arm circuit body 110U and the first lower-arm circuit body 110L. As illustrated in FIG. 5, the second capacitor 131 is disposed between the second upper-arm circuit body 210U and the second lower-arm circuit body 210L.

The negative electrode wiring 122 is led out to the front surface of the substrate 120 as illustrated in FIG. 4, and the positive electrode wiring 121 is led out to the back surface of the substrate 120 as illustrated in FIG. 5.

As illustrated in FIG. 5, the control signal wiring 124 of the first switching element 101 constituting the first upper-arm circuit body 101U and the control signal wiring 124 of the fourth switching element 104 constituting the second lower-arm circuit body 210L are arranged on the same surface of the substrate 120 so as to be oriented in the same direction. Thus, wire bonding to the control signal wiring 124 can be easily performed.

Figure 6:
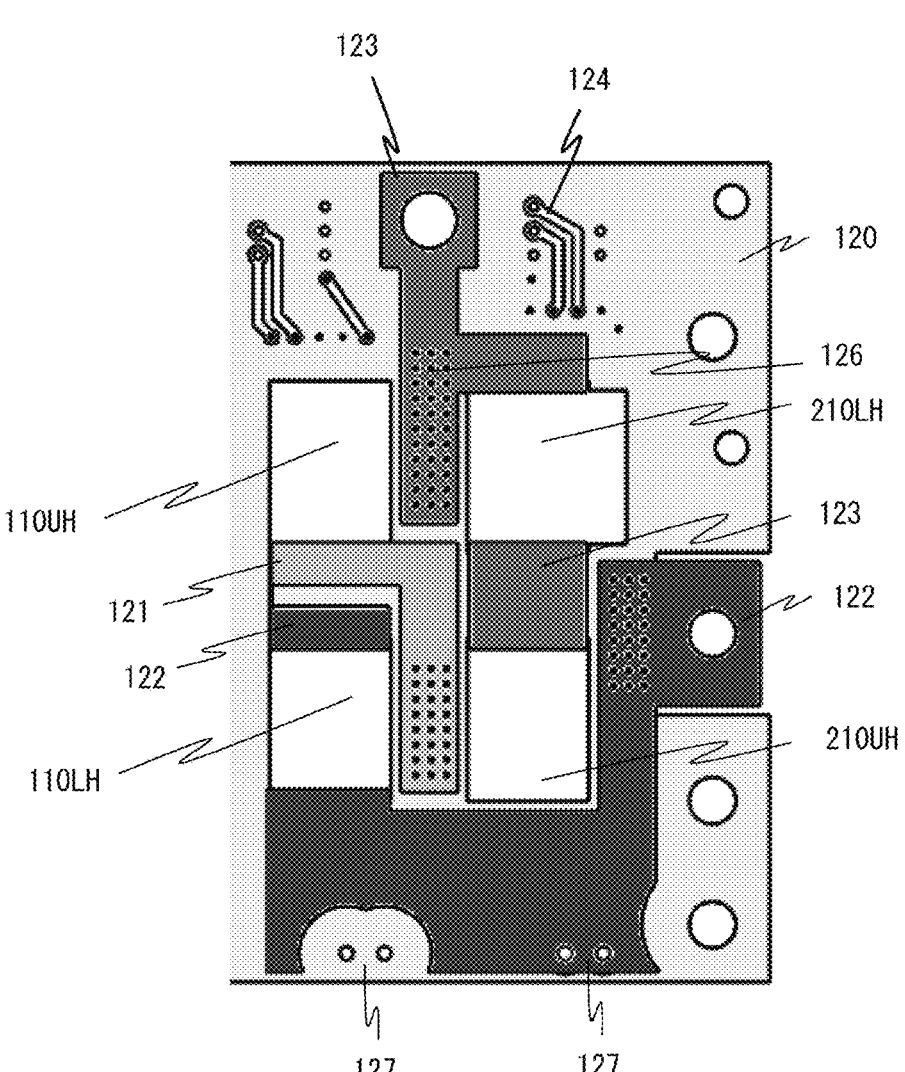
FIG. 6 is a wiring diagram of a front surface of a substrate of the power semiconductor device.
Figure 7:
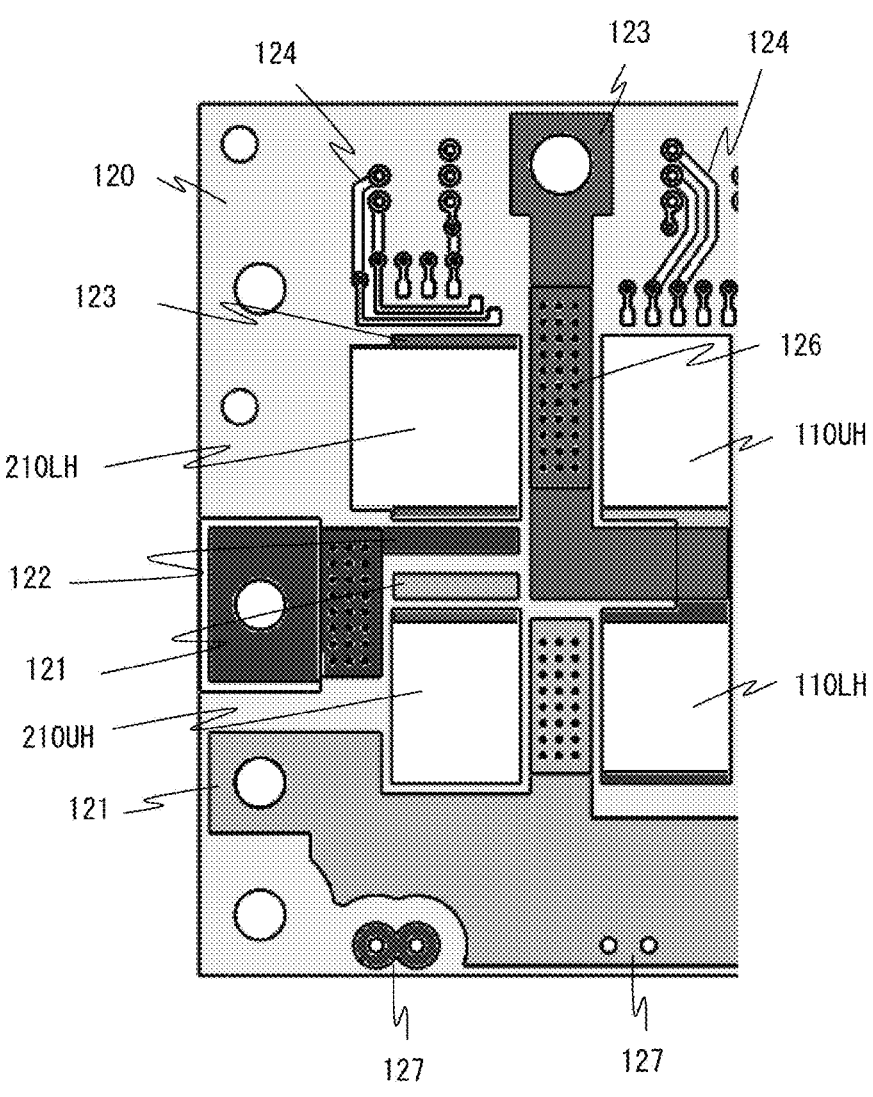
FIG. 7 is a wiring diagram of a back surface of a substrate of the power semiconductor device.

FIG. 6 is a wiring diagram of the front surface of the substrate 120 of the power semiconductor device 100. FIG. 7 is a wiring diagram of the back surface of the substrate 120 of the power semiconductor device 100.

The substrate 120 is provided with through-holes 110UH and 110LH in which the first upper-arm circuit body 110U and the first lower-arm circuit body 110L are arranged, respectively, and is further provided with through-holes 210UH and 210LH in which the second upper-arm circuit body 210U and the second lower-arm circuit body 210L are arranged.

The positive electrode wiring 121, the negative electrode wiring 122, the output wiring 123, and the control signal wiring 124 are pattern-formed on the insulating layer of the substrate 120 by etching or the like. The substrate 120 is provided with a through-hole via 126, and the wirings of the positive electrode wiring 121, the negative electrode wiring 122, the output wiring 123, and the control signal wiring 124 are connected between the front surface and the back surface of the substrate 120.

The positive electrode and the negative electrode of the first capacitor 130 are connected to the positive electrode wiring 121 and the negative electrode wiring 122 between the through-hole 110UH and the through-hole 110LH on the front surface of the substrate 120 illustrated in FIG. 6. Here, the positive electrode wiring 121 and the negative electrode wiring 122 are formed in a wide area, and can be bonded in a wide area when being connected to the first capacitor 130, the first conductor 111, and the fourth conductor 114.

The positive electrode and the negative electrode of the second capacitor 131 are connected to the positive electrode wiring 121 and the negative electrode wiring 122 between the through-hole 210UH and the through-hole 210LH on the back surface of the substrate 120 illustrated in FIG. 7. Here, the positive electrode wiring 121 and the negative electrode wiring 122 are formed in a wide area, and can be similarly bonded to the second capacitor 131 or the like in a wide area.

As illustrated in FIG. 7, the control signal wiring 124 is disposed on the same surface of the substrate 120 so as to be oriented in the same direction. A wiring terminal 127 to which the third capacitor 310 described later is connected is disposed on the substrate 120.

The power semiconductor device to which the present embodiment is not applied does not include a capacitor in the power semiconductor device. For this reason, the wiring path from the switching element inside the power semiconductor device to the capacitor outside the power semiconductor device becomes long, and the inductance of the wiring path cannot be reduced.

On the other hand, in the present embodiment, since the capacitor is also included in the power semiconductor device 100, the wiring path from the switching element to the capacitor can be shortened, and the inductance of the wiring path can be reduced.

In addition, in the present embodiment, the positive electrode wiring 121 and the negative electrode wiring 122 on the front surface of the substrate 120 and the output wiring 123 on the back surface of the substrate 120 are laminated, in other words, provided so as to face each other. Here, with reference to FIG. 1, attention is paid to the current flowing from the positive electrode of the first capacitor 130 to the positive electrode wiring 121, the first upper-arm circuit body 110U, the output wiring 123, the first lower-arm circuit body 110L, the negative electrode wiring 122, and the negative electrode of the first capacitor 130. The direction in which the current flows through the positive electrode wiring 121 on the front surface of the substrate 120 and the direction in which the current flows through the output wiring 123 on the back surface of the substrate 120 are opposite to each other. Similarly, the direction in which this current flows through the output wiring 123 on the back surface of the substrate 120 and the direction in which this current flows through the negative electrode wiring 122 on the front surface of the substrate 120 are opposite to each other. As a result, the magnetic flux generated by the flowing current is canceled out, so that the magnetic flux decreases and the inductance can be reduced.

Further, the positive electrode wiring 121, the negative electrode wiring 122, and the output wiring 123 are bonded to the first capacitor 130 and the first conductor 111 to the fourth conductor 114 in a wide area. Therefore, since the currents flowing in the opposite directions described above are in a wide region, the magnetic flux to be canceled out can be increased, and the inductance can be more effectively reduced.

Second Embodiment

Figure 8:
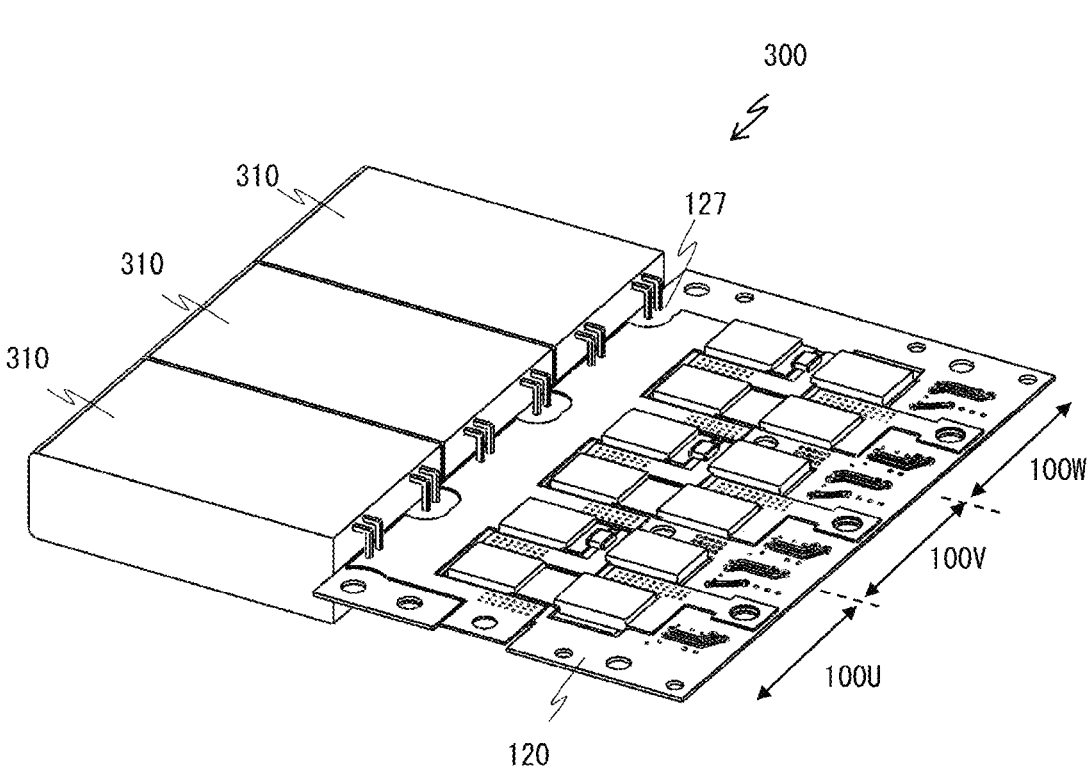
FIG. 8 is a perspective view of a power conversion device.

FIG. 8 is a perspective view of a power conversion device 300.

The power conversion device 300 is configured as an inverter that drives a motor using the power semiconductor device 100 described in the first embodiment.

As illustrated in FIG. 8, the power semiconductor devices 100U, 100V, and 100W are used as the U-phase, V-phase, and W-phase of the inverter corresponding to the three-phase motor. The power semiconductor devices 100U, 100V, and 100W have the same configuration as the power semiconductor device 100 described in the first embodiment. However, in the present embodiment, the power semiconductor devices 100U, 100V, and 100W are formed on one substrate 120. Further, the third capacitor 310 is connected to the wiring terminal 127 of the substrate 120. The third capacitor 310 is a large-capacity smoothing capacitor, is formed of a film capacitor or the like, and is connected in parallel to the first capacitor 130 and the second capacitor 131.

The inverter including the power semiconductor devices 100U, 100V, and 100W converts DC power supplied from a battery or the like into AC power to drive a motor.

The third capacitor 310 has a lower heat-resistant temperature but a larger capacitance than the first capacitor 130 and the second capacitor 131. By disposing the first capacitor 130 and the second capacitor 131 close to the upper and lower-arm circuit bodies and shortening the wiring lengths thereof, the inductance of the wiring path can be reduced, and the DC voltage fluctuation due to an increase in the capacitance by connecting the third capacitor 310 in parallel thereto can be suppressed.

Figure 9:
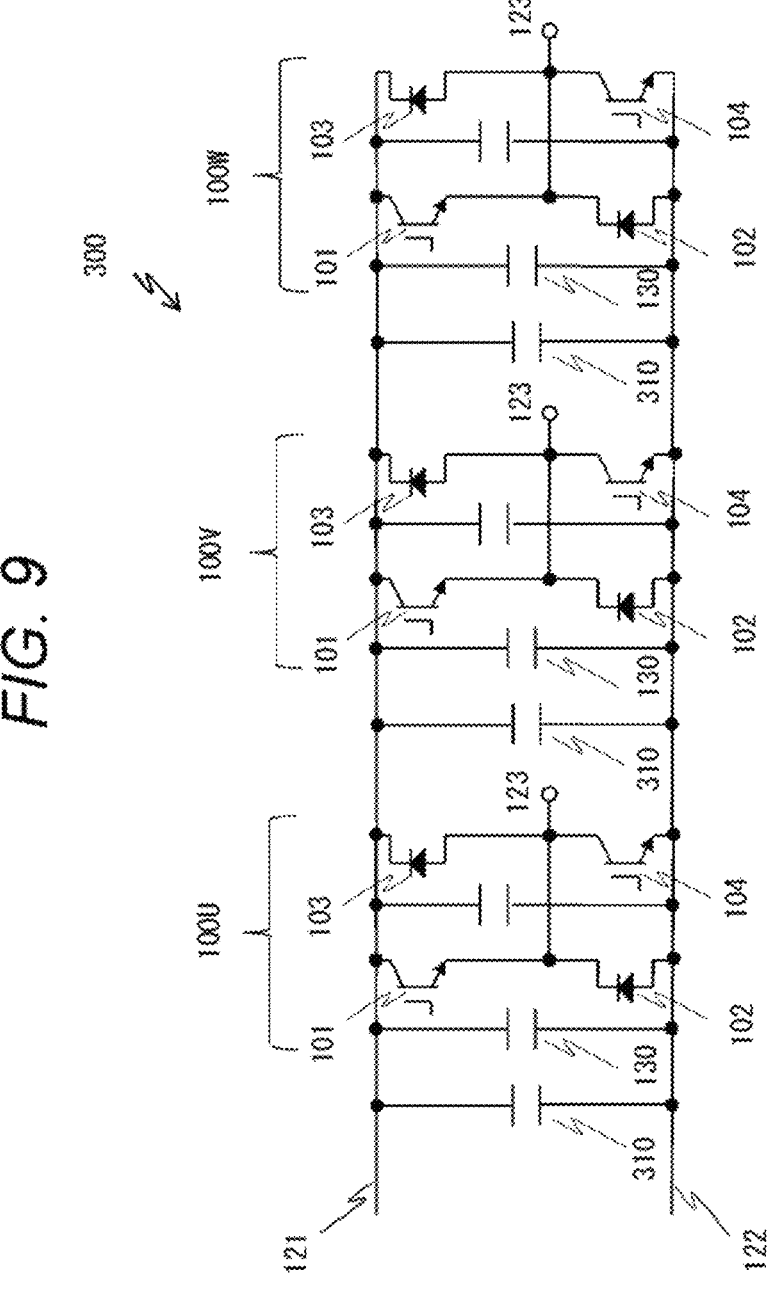
FIG. 9 is a circuit configuration diagram of the power conversion device.

FIG. 9 is a circuit configuration diagram of the power conversion device 300.

The power semiconductor devices 100U, 100V, and 100W have the same configuration as the power semiconductor device 100 described with reference to FIG. 3. In the present embodiment, the third capacitor 310 is connected between the DC wirings, that is, the positive electrode wiring 121 and the negative electrode wiring 122. Then, the power semiconductor devices 100U, 100V, and 100W are connected in parallel between the positive electrode wiring 121 and the negative electrode wiring 122.

Figure 10:
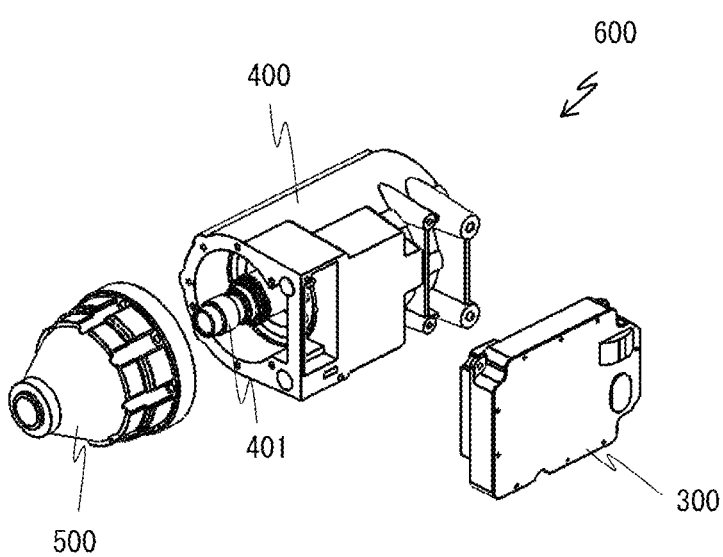
FIG. 10 is an exploded perspective view of an electric system.

FIG. 10 is an exploded perspective view of an electric system 600.

The electric system 600 includes the power conversion device 300, a motor 400, and a gear 500.

The power conversion device 300 has the configuration described with reference to FIGS. 8 and 9. The third capacitor 310 is not necessarily provided. The power conversion device 300 converts DC power supplied from a battery or the like into AC power, and the output wiring 123 thereof is connected to a winding of the motor 400 to drive the motor 400.

The motor 400 is driven using the AC power output from the power conversion device 300. Then, a rotational torque is generated in the output shaft 401.

The gear 500 is connected to the output shaft 401 of the motor 400 to change the rotation speed of an output shaft 401. The power conversion device 300, the motor 400, and the gear 500 are fastened by screws or the like to be integrally formed.

According to the embodiment described above, the following operational effects can be obtained.

(1) In a power semiconductor device 100 including a first upper-arm circuit body 110U configured by sandwiching a first switching element 101 constituting an upper-arm circuit between a first conductor 111 and a second conductor 112, and a first lower-arm circuit body 110L configured by sandwiching a second switching element 102 constituting a lower-arm circuit between a third conductor 113 and a fourth conductor 114, the power semiconductor device 100 includes: a substrate 120 in which a positive electrode wiring 121 connected to the first conductor 111 on a high potential side and a negative electrode wiring 122 connected to the fourth conductor 114 on a low potential side are provided on one surface, and an output wiring 123 connected to the second conductor 112 and the third conductor 113 is provided on the other surface so as to face the positive electrode wiring 121 and the negative electrode wiring 122; and a first capacitor 130 that smooths DC power supplied to the first upper-arm circuit body 110U and the first lower-arm circuit body 110L, wherein the substrate 120 is disposed between the first upper-arm circuit body 110U and the first lower-arm circuit body 110L, and the first capacitor 130 is disposed between the first upper-arm circuit body 110U and the first lower-arm circuit body 110L and is connected to the positive electrode wiring 121 and the negative electrode wiring 122 on the substrate 120. As a result, the inductance of the wiring path can be reduced.

The present invention is not limited to the above-described embodiments, and other forms conceivable within the scope of the technical idea of the present invention are also included within the scope of the present invention as long as the features of the present invention are not impaired. In addition, the above-described embodiments may be combined.

REFERENCE SIGNS LIST 100, 100U, 100V, 100W Power semiconductor device
101 First switching element 101D Bonding material
102 Second switching element
103 Third switching element
104 Fourth switching element
110U First upper-arm circuit body
110L First lower-arm circuit body
110UH, 110LH, 210UH, 210LH Through-hole
111 First conductor
111E, 112C Connection terminal
112 Second conductor
113 Third conductor
114 Fourth conductor
120 Substrate
121 Positive electrode wiring
122 Negative electrode wiring
123 Output wiring
124 Control signal wiring
126 Through-hole via
127 Wiring terminal
130 First capacitor
131 Second capacitor
141, 142 Insulator
151 First cooler
152 Second cooler
300 Power conversion device
310 Third capacitor
400 Motor
401 Output shaft
500 Gear
600 Electric system

The invention claimed is:

1. A power semiconductor device comprising a first upper-arm circuit body configured by sandwiching a first switching element constituting an upper-arm circuit between a first conductor and a second conductor, and a first lower-arm circuit body configured by sandwiching a second switching element constituting a lower-arm circuit between a third conductor and a fourth conductor, the power semiconductor device comprising:

a substrate in which a positive electrode wiring connected to the first conductor on a high potential side and a negative electrode wiring connected to the fourth conductor on a low potential side are provided on one surface, and an output wiring connected to the second conductor and the third conductor is provided on an other surface so as to face the positive electrode wiring and the negative electrode wiring; and a first capacitor that smooths DC power supplied to the first upper-arm circuit body and the first lower-arm circuit body, wherein the substrate is disposed between the first upper-arm circuit body and the first lower-arm circuit body, and the first capacitor is disposed between the first upper-arm circuit body and the first lower-arm circuit body, and is connected to the positive electrode wiring and the negative electrode wiring on the substrate.

2. The power semiconductor device according to claim 1, wherein a first cooler is provided on surfaces of the first conductor and the fourth conductor opposite to surfaces facing the first switching element and the second switching element via an insulator, and a second cooler is provided on surfaces of the second conductor and the third conductor opposite to surfaces facing the first switching element and the second switching element via an insulator.

3. The power semiconductor device according to claim 1, wherein an upper surface of the first capacitor is set lower than upper surfaces of the first conductor and the fourth conductor.

4. The power semiconductor device according to claim 1, further comprising:

a second upper-arm circuit body including a third switching element connected in parallel to the first switching element;

a second lower-arm circuit body including a fourth switching element connected in parallel to the second switching element; and a second capacitor that smooths DC power supplied to the second upper-arm circuit body and the second lower-arm circuit body, wherein the second capacitor is disposed between the second upper-arm circuit body and the second lower-arm circuit body, and is connected to the positive electrode wiring and the negative electrode wiring on the substrate.

5. The power semiconductor device according to claim 4, wherein an array of the first upper-arm circuit body and the first lower-arm circuit body and an array of the second upper-arm circuit body and the second lower-arm circuit body are parallel to each other, and a control signal wiring of the first switching element constituting the first upper-arm circuit body and a control signal wiring of the fourth switching element constituting the second lower-arm circuit body are oriented in a same direction.

6. A power conversion device comprising a plurality of the power semiconductor devices according to claim 4 connected in parallel by DC wiring.

7. The power conversion device according to claim 6, wherein a third capacitor is provided on the DC wiring corresponding to each of the power semiconductor devices.

8. An electric system comprising:

the power conversion device according to claim 6;

a motor driven using AC power output from the power conversion device; and a gear connected to an output shaft of the motor to change a rotation speed of the output shaft, the power conversion device, the motor, and the gear being integrally provided.

* * * * *